US012282233B2

(12) United States Patent
Wang et al.

(10) Patent No.: US 12,282,233 B2
(45) Date of Patent: Apr. 22, 2025

(54) ARRAY SUBSTRATE AND DISPLAY DEVICE

(71) Applicants: BEIJING BOE DISPLAY TECHNOLOGY CO., LTD., Beijing (CN); BOE Technology Group Co., Ltd., Beijing (CN)

(72) Inventors: Tingting Wang, Beijing (CN); Xu Wang, Beijing (CN); Qi Wang, Beijing (CN); Yan Yan, Beijing (CN); Yu Ma, Beijing (CN); Xiaofeng Yin, Beijing (CN); Zhiqiang Ma, Beijing (CN); Tao Gong, Beijing (CN); Haoyan Ren, Beijing (CN)

(73) Assignees: BEIJING BOE DISPLAY TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/547,390

(22) PCT Filed: Nov. 29, 2022

(86) PCT No.: PCT/CN2022/134938
§ 371 (c)(1),
(2) Date: Aug. 22, 2023

(87) PCT Pub. No.: WO2024/113147
PCT Pub. Date: Jun. 6, 2024

(65) Prior Publication Data
US 2024/0210766 A1 Jun. 27, 2024

(51) Int. Cl.
*G02F 1/1343* (2006.01)
*G02F 1/1362* (2006.01)
*H01L 27/12* (2006.01)

(52) U.S. Cl.
CPC .. *G02F 1/134318* (2021.01); *G02F 1/136209* (2013.01); *G02F 1/136286* (2013.01); *H01L 27/124* (2013.01)

(58) Field of Classification Search
CPC ................. G02F 1/1343; G02F 1/1362; G02F 1/136286; H01L 27/124
See application file for complete search history.

(56) References Cited

U.S. PATENT DOCUMENTS 8,194,211 B2 6/2012 Nagai et al.
9,508,744 B2 11/2016 Zhou et al.
(Continued)

FOREIGN PATENT DOCUMENTS

CN 101498870 A 8/2009
CN 101539680 A 9/2009
(Continued)

OTHER PUBLICATIONS

Wang et al., English translation for CN-113467144-A (Year: 2021).*

*Primary Examiner* — Jonathan Y Jung
(74) *Attorney, Agent, or Firm* — Westman, Champlin & Koehler, P.A.

(57) ABSTRACT

An array substrate includes: a base substrate, a light shielding layer on a first surface of the base substrate, and a plurality of pixel units and a first common electrode bus on a second surface of the base substrate. The base substrate includes a display region, first and second peripheral regions. Orthographic projections of the pixel units on the base substrate are arranged in an array in the display region. At least part of an orthographic projection of the light shielding layer and at least part of an orthographic projection of the first common electrode bus on the base substrate are in the second peripheral region, and the first common electrode bus is electrically connected to the common electrode included in at least one pixel unit. A distribution (Continued)

density of the first common electrode bus in the first peripheral region is smaller than that in the second peripheral region.

18 Claims, 17 Drawing Sheets

(56) References Cited

U.S. PATENT DOCUMENTS

| | | |
|---|---|---|
| 11,527,598 B2 | 12/2022 | Feng et al. |
| 2009/0237600 A1 | 9/2009 | Nagai et al. |
| 2010/0259712 A1* | 10/2010 | Jeong ................ G02F 1/134309 |
| | | 349/128 |
| 2013/0342771 A1* | 12/2013 | Kim .................... G02B 5/3083 |
| | | 349/15 |
| 2014/0374763 A1 | 12/2014 | Zhou et al. |
| 2016/0077385 A1* | 3/2016 | Cao .................. G02F 1/133512 |
| | | 445/25 |
| 2019/0094456 A1* | 3/2019 | Lee ...................... G02B 6/0088 |
| 2021/0335983 A1 | 10/2021 | Feng et al. |

FOREIGN PATENT DOCUMENTS

| | | | |
|---|---|---|---|
| CN | 201622825 U | * 11/2010 | |
| CN | 103926724 A | 7/2014 | |
| CN | 106684100 A | 5/2017 | |
| CN | 107238965 A | 10/2017 | |
| CN | 110794610 A | 2/2020 | |
| CN | 113192426 A | 7/2021 | |
| CN | 113467144 A | * 10/2021 | ....... G02F 1/133512 |
| CN | 216956909 U | 7/2022 | |
| KR | 20130117103 A | 10/2013 | |

* cited by examiner

Touch direction

ARRAY SUBSTRATE AND DISPLAY DEVICE

CROSS REFERENCE TO RELATED APPLICATION(S)

This application is a Section 371 National Stage Application of International Application No. PCT/CN2022/134938, filed on Nov. 29, 2022, entitled "ARRAY SUBSTRATE AND DISPLAY DEVICE", the disclosure of which is incorporated herein by reference in its entirety.

TECHNICAL FIELD

The present disclosure relates to the field of display technology, and in particular to an array substrate and a display device.

BACKGROUND

At present, in order to achieve a narrow-border or even borderless design, it is needed to provide an array substrate on a light emitting side of a display panel and provide an opposite substrate on a light incident side of the display panel. However, it is needed to provide bulk metals in a non-display region of the array substrate, and those bulk metals may reflect ambient light and cause a bright metal edge, which affects a display effect.

The above information disclosed in this section is merely for the understanding of the background of the technical concept of the present disclosure. Therefore, the above information may include information that does not constitute the related art.

SUMMARY

According to an aspect of the present disclosure, an array substrate is provided, including: a base substrate including a first surface and a second surface opposite to the first surface, the base substrate includes a display region and a peripheral region surrounding the display region, the peripheral region includes a first peripheral region surrounding the display region and a second peripheral region surrounding the first peripheral region: a plurality of pixel units located on the second surface of the base substrate, orthographic projections of the plurality of pixel units on the base substrate are located in the display region and distributed in an array, and at least one of the plurality of pixel units includes a common electrode: a light shielding layer located on the first surface of the base substrate, an orthographic projection of the light shielding layer on the base substrate is located in the peripheral region, and at least part of the orthographic projection of the light shielding layer on the base substrate is located in the second peripheral region: and a first common electrode bus located on the second surface of the base substrate, an orthographic projection of the first common electrode bus on the base substrate is located at least partially in the second peripheral region, and the first common electrode bus is electrically connected to the common electrode, a material of the first common electrode bus includes a metal material, and a distribution density of the first common electrode bus in the first peripheral region is less than a distribution density of the first common electrode bus in the second peripheral region.

According to some exemplary embodiments, the first common electrode bus includes a first part located in the first peripheral region and a second part located in the second peripheral region, the second part includes a block-shaped metal portion, and the first part includes a strip-shaped metal portion.

According to some exemplary embodiments, the first part of the first common electrode bus located in the first peripheral region includes a plurality of strip-shaped metal portions and at least one strip-shaped slit, and the plurality of strip-shaped metal portions and the at least one strip-shaped slit are alternately arranged in a direction from an edge of the base substrate to the display region of the base substrate.

According to some exemplary embodiments, the strip-shaped slit has a first width in a first direction, the strip-shaped metal portion has a second width in the first direction, and the first direction is substantially perpendicular to an extension direction of the strip-shaped slit or an extension direction of the strip-shaped metal portion: and a value of dividing the first width by a sum of the first width and the second width is greater than or equal to 0.5.

According to some exemplary embodiments, an orthographic projection of a boundary of the first common electrode bus close to the display region on the base substrate is located at a junction of the first peripheral region and the second peripheral region.

According to some exemplary embodiments, the orthographic projection of the boundary of the first common electrode bus close to the display region on the base substrate is located in the orthographic projection of the light shielding layer on the base substrate.

According to some exemplary embodiments, the base substrate includes a first side, a second side, a third side and a fourth side, the first side and the second side are arranged opposite to each other, and the third side and the fourth side are arranged opposite to each other: the array substrate further includes a data signal line and a scanning signal line arranged on the second surface of the base substrate, the scanning signal line extends from the first side toward the second side, and the data signal line extends from the third side toward the fourth side; and at least two columns of dummy pixel units are arranged in the first peripheral region on at least one of the first side and the second side.

According to some exemplary embodiments, the base substrate includes a first side, a second side, a third side and a fourth side, the first side and the second side are arranged opposite to each other, and the third side and the fourth side are arranged opposite to each other: the array substrate further includes a data signal line and a scanning signal line arranged on the second surface of the base substrate, the scanning signal line extends from the first side toward the second side, and the data signal line extends from the third side toward the fourth side: and at least one column of dummy pixel units is arranged between the first part and the display region in the first peripheral region on at least one of the first side and the second side.

According to some exemplary embodiments, at least one row of dummy pixel units is arranged in the first peripheral region on at least one of the third side and the fourth side.

According to some exemplary embodiments, the array substrate further includes a second common electrode bus located on the second surface of the base substrate, an orthographic projection of the second common electrode bus on the base substrate is located in the first peripheral region and the second peripheral region, and the second common electrode bus is electrically connected to the first common electrode bus.

According to some exemplary embodiments, the array substrate includes a first metal conductive layer and a first transparent conductive layer arranged on the second surface of the base substrate, the first common electrode bus is located in the first metal conductive layer, and the second common electrode bus is located in the first transparent conductive layer.

According to some exemplary embodiments, on at least one of the first side and the second side, the first part of the first common electrode bus located in the first peripheral region includes a plurality of first strip-shaped metal portions extending in a second direction, and a plurality of second strip-shaped metal portions extending in a third direction intersecting with the second direction.

According to some exemplary embodiments, the first direction intersects with the third direction.

According to some exemplary embodiments, on at least one of the first side and the second side, the first part of the first common electrode bus located in the first peripheral region includes a plurality of first strip-shaped metal portions extending in a second direction, and a plurality of second strip-shaped metal portions extending in a third direction intersecting with the second direction.

According to some exemplary embodiments, the second common electrode bus includes at least one second opening located in the first peripheral region, and an orthographic projection of at least one intersecting portion between the plurality of first strip-shaped metal portions and the plurality of second strip-shaped metal portions on the base substrate overlaps at least partially with an orthographic projection of the at least one second opening on the base substrate.

According to some exemplary embodiments, the base substrate includes a first side, a second side, a third side and a fourth side, the first side and the second side are arranged opposite to each other, and the third side and the fourth side are arranged opposite to each other: the array substrate further includes a data signal line and a scanning signal line arranged on the second surface of the base substrate, the scanning signal line extends from the first side toward the second side, and the data signal line extends from the third side toward the fourth side: and at least one column of dummy pixel units is arranged between the first part and the display region in the first peripheral region on at least one of the first side and the second side.

According to some exemplary embodiments, the array substrate further includes a second common electrode bus located on the second surface of the base substrate, an orthographic projection of the second common electrode bus on the base substrate is located in the first peripheral region and the second peripheral region, and the second common electrode bus is electrically connected to the first common electrode bus.

According to some exemplary embodiments, on at least one of the first side and the second side, the first part of the first common electrode bus located in the first peripheral region includes a plurality of first strip-shaped metal portions extending in a second direction, and a plurality of second strip-shaped metal portions extending in a third direction intersecting with the second direction.

According to some exemplary embodiments, the second common electrode bus includes at least one second opening located in the first peripheral region, and an orthographic projection of at least one intersecting portion between the plurality of first strip-shaped metal portions and the plurality of second strip-shaped metal portions on the base substrate overlaps at least partially with an orthographic projection of the at least one second opening on the base substrate.

According to some exemplary embodiments, on at least one of the first side and the second side, a part of the scanning signal line located in the peripheral region includes a first scanning signal sub-portion and a second scanning signal sub-portion, the first scanning signal sub-portion extends in a first direction, and the second scanning signal sub-portion extends in the second direction intersecting with the first direction: and an extension direction of the second scanning signal sub-portion is substantially parallel to an extension direction of the data signal line.

According to some exemplary embodiments, an orthographic projection of the first scanning signal sub-portion on the base substrate overlaps at least partially with the orthographic projection of the at least one second opening on the base substrate: and/or an orthographic projection of at least one intersecting portion of the first strip-shaped metal portion, the second strip-shaped metal portion and the first scanning signal sub-portion on the base substrate overlaps at least partially with the orthographic projection of the at least one second opening on the base substrate.

According to some exemplary embodiments, the second part includes at least one first opening, and an orthographic projection of the at least one first opening on the base substrate overlaps at least partially with the orthographic projection of the first scanning signal sub-portion on the base substrate.

According to some exemplary embodiments, a ratio of a length of the at least one strip-shaped slit in an extension direction of the at least one strip-shaped slit to a width of the at least one strip-shaped slit in a direction perpendicular to the extension direction of the at least one strip-shaped slit is greater than or equal to 10.

According to some exemplary embodiments, the array substrate further includes a data signal line and a scanning signal line arranged on the second surface of the base substrate, and the array substrate further includes a second metal conductive layer arranged on the base substrate and a second transparent conductive layer arranged on the base substrate: the data signal line is located in the first metal conductive layer, and the scanning signal line is located in the second metal conductive layer: and the at least one of the plurality of pixel units further includes a pixel electrode located in the first transparent conductive layer, and the common electrode is located in the second transparent conductive layer.

In another aspect, a display device is provided, including: the array substrate as described above: an opposite substrate arranged opposite to the array substrate: and a liquid crystal layer located between the array substrate and the opposite substrate, a light emitting surface of the display device is the first surface of the base substrate in the array substrate.

BRIEF DESCRIPTION OF THE DRAWINGS

The above contents and other objectives, features and advantages of the present disclosure will be more apparent through the following descriptions of the embodiments of the present disclosure with reference to the accompanying drawings.

DETAILED DESCRIPTION OF EMBODIMENTS

Figure 1:
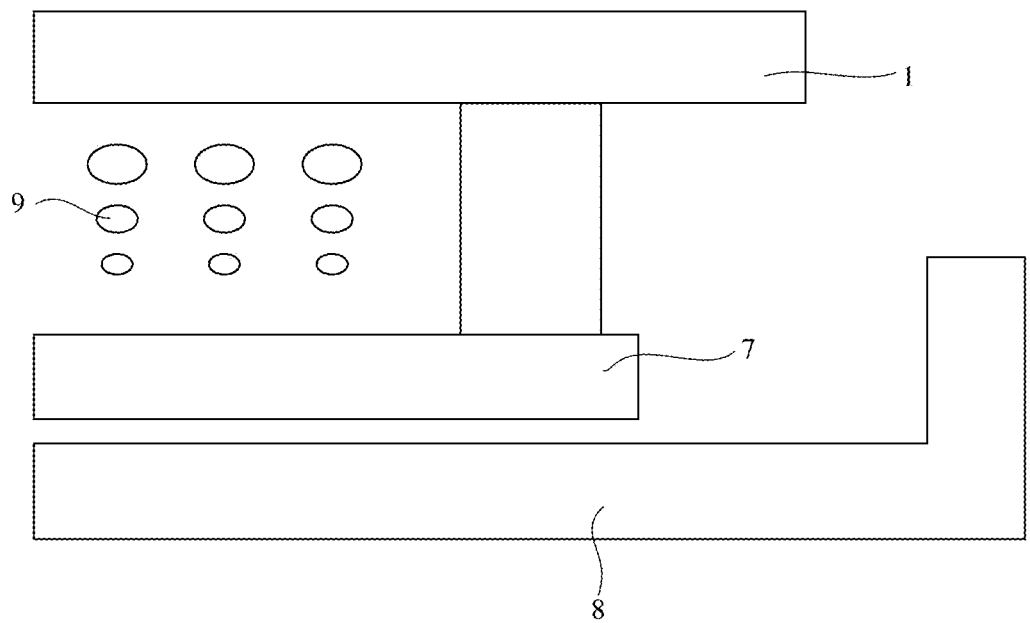
FIG. 1 is a schematic structural diagram of a display panel according to some exemplary embodiments of the present disclosure.

In order to make objectives, technical solutions and advantages of the present disclosure clearer, technical solutions of embodiments of the present disclosure will be clearly and completely described below with reference to the accompanying drawings. Obviously, the described embodiments are merely some embodiments rather than all embodiments of the present disclosure. Based on the described embodiments of the present disclosure, all additional embodiments obtained by those ordinary skilled in the art without carrying out inventive effort fall within the scope of protection of the present disclosure.

It should be noted that, in the accompanying drawings, for clarity and/or description purposes, sizes and relative sizes of elements may be enlarged. Accordingly, the size and relative size of each element need not to be limited to those shown in the drawings. In the specification and the accompanying drawings, the same or similar reference numerals represent the same or similar components.

When an element is described as being "on", "connected to" or "coupled to" another element, the element may be directly on the another element, directly connected to the another element, or directly coupled to the another element, or an intermediate element may be provided. However, when an element is described as being "directly on", "directly connected to" or "directly coupled to" another element, no intermediate element is provided. Other terms and/or expressions used to describe a relationship between elements, such as "between" and "directly between", "adjacent" and "directly adjacent", "on" and "directly on", and so on, should be interpreted in a similar manner.

It should be noted that although the terms "first", "second", and so on may be used here to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from teachings of the present disclosure.

It should be noted that the expressions "the same layer", "arranged in the same layer" or similar expressions refer to a layer structure that is formed by firstly forming a film layer used to form a specific pattern through one and same film forming process, and then patterning the film layer through one-time patterning process by using one and same mask. Depending on different specific patterns, the one-time patterning process may include a plurality of exposure, development or etching processes, and the specific patterns in the formed layer structure may be continuous or discontinuous. These specific patterns may also be at different heights or have different thicknesses.

Herein, unless otherwise specified, the expression "electrically connected" may mean that two components or elements are directly electrically connected. For example, it may mean that a component or element A is in direct contact with a component or element B, and an electrical signal may be transmitted between the two. It may also mean that two components or elements are electrically connected through a conductive medium such as a conductive wire. For example, the component or element A is electrically connected to the component or element B through the conductive wire so that an electrical signal is transmitted between the two. It may also mean that two components or elements are electrically connected by at least one electronic component. For example, the component or element A is electrically connected to the component or element B by at least one thin film transistor so that an electrical signal is transmitted between the two.

FIG. 1 is a schematic structural diagram of a display panel according to some exemplary embodiments of the present disclosure. As shown in FIG. 1, in some embodiments, the display panel may be a liquid crystal display panel. For example, In-cell technology may be adopted for the liquid crystal display panel to achieve an integration of display and touch. For example, in the liquid crystal display panel according to the embodiments of the present disclosure, FIC (abbreviation for Full In Cell) technology may be used.

In the FIC technology, a single-layer touch wiring design is adopted, and a multi-point touch is achieved using a self-capacitance principle. In order to solve a signal interference caused by an integration of display function and touch function, a "time-sharing scanning" manner is used in the FIC technology, which divides a unit time into two parts, one part is used for touch scanning, and the other part is used for display scanning, and there is no mutual interference between the two.

Referring to FIG. 1, the display panel may include an array substrate 1, an opposite substrate 7, and a liquid crystal layer 9 located between the array substrate 1 and the opposite substrate 7. The opposite substrate 7 is arranged opposite to the array substrate 1.

For a non-touch conventional display panel, the opposite substrate 7 is located on a light emitting side of the display panel. To prevent static electricity, a transparent conductive layer (such as an ITO layer) is generally coated on a back surface of the opposite substrate 7.

For a touch display panel using the FIC technology, if the opposite substrate 7 is located on the light emitting side of the display panel, the transparent conductive layer used to prevent static electricity may affect a touch effect when a finger touches the display panel.

In the embodiments of the present disclosure, the array substrate 1 is located on the light emitting side of the display panel, and the opposite substrate 7 is located on a light incident side of the display panel. Specifically, the display panel further includes a backlight module 8, and the opposite substrate 7 is closer to the backlight module 8 than the array substrate 1.

Through researches, the inventors found that users have an increasing aesthetic appreciation for an appearance of a display product. A borderless display product, especially a four-side borderless display product, has a high-end appearance and is deeply loved by customers due to an exquisite and beautiful appearance. The four-side borderless display product includes a display region and a peripheral region (i.e., non-display region) surrounding the display region. The peripheral region is provided with bulk metals such as a fan-out line, a gate driving circuit, and a common electrode bus, etc. Those bulk metals may reflect ambient light and cause a bright metal edge, which may affect the display effect. By coating ink in the peripheral region, it is possible to avoid a light reflection of bulk metals. However, due to a limitation of a coating accuracy of ink, for example, since the coated ink generally has a deviation of ±0.15 mm, a designed center value of ink needs to be 0.15 mm away from the display region to avoid an ink intrusion into the display region. Therefore, a region of 0~0.3 mm from a boundary of the display region may not be coated by ink, and the bulk metals of the common electrode bus exposed in such region may still cause the bright metal edge.

That is, the array substrate faces the user when the display product is in use. The array substrate is generally provided with bulk metals, and the light reflection phenomenon may easily occur if a distribution density the metals is too high. Especially, in a region where a gate driving circuit and/or a common electrode bus of the array substrate are/is located, bulk metals tend to exist to result in a high distribution density of metals, leading to the light reflection phenomenon. For the display region, the bulk metals may not have a high distribution density and a large width, and the light reflection phenomenon is not significant. For four-side narrow-border or four-side borderless designs, a layer of ink may be coated to block the light reflection of metals. For example, the ink coating may be performed after an alignment of the display panel is completed. Specifically, the ink may be coated in four peripheral regions of the array substrate facing the user. The ink is coated along an outer edge of the array substrate toward a center of the array substrate, and an end point of the coating is at a particular distance from the display region. The peripheral region within a range of the particular distance is covered by diffused ink. After the ink coating is completed, the ink is irradiated by a device with the coated ink (with built-in UV curing) to solidify the ink, and then a polarizer is attached. However, through researches, the inventors found that in actual situations, the ink may fail to fully cover the peripheral region in the range of the particular distance. As a result, the bulk metals in the non-display region of the array substrate may still reflect ambient light and cause a bright metal edge, which affects the display effect.

Referring to FIG. 3A, FIG. 3B, FIG. 12 and FIG. 15, the array substrate 1 may include a base substrate 10, which includes a first surface 101 and a second surface 102 arranged opposite to each other. The base substrate 10 includes a display region AA and a peripheral region NA surrounding the display region. The peripheral region NA includes a first peripheral region NA1 and a second peripheral region NA2. The first peripheral region NA1 surrounds the display region AA, and the second peripheral region NA2 surrounds the first peripheral region NA1. That is, the first peripheral region NA1 is a part of the peripheral region NA close to the display region AA, and the second peripheral region NA2 is a part of the peripheral region NA away from the display region AA.

It should be noted that herein, the expression "display region" represents a region where a pixel is effectively displayed.

As described above, during a process of coating the ink, the ink may be coated in the four peripheral regions of the array substrate facing the user. The ink is coated along the outer edge of the array substrate toward the center of the array substrate, and the end point of the coating is at a particular distance from the display region. The peripheral region in a range of the particular distance is covered by the diffused ink. For example, the particular distance may be about 300 microns. In the embodiments of the present disclosure, the first peripheral region NA1 may correspond to the peripheral region within the particular distance, that is, a width of the first peripheral region NA1 may be about 300 microns. In other words, the first peripheral region NA1 may be a circular region that extends a particular distance (such as about 300 microns) outwardly from an outer boundary of the display region AA.

The array substrate may further include a light shielding layer 2 which is located on the first surface 101 of the base substrate. An orthographic projection of the light shielding layer 2 on the base substrate 10 is located in the peripheral region NA, and at least part of the orthographic projection of the light shielding layer 2 on the base substrate 10 is located in the second peripheral region NA2.

Figure 3A:
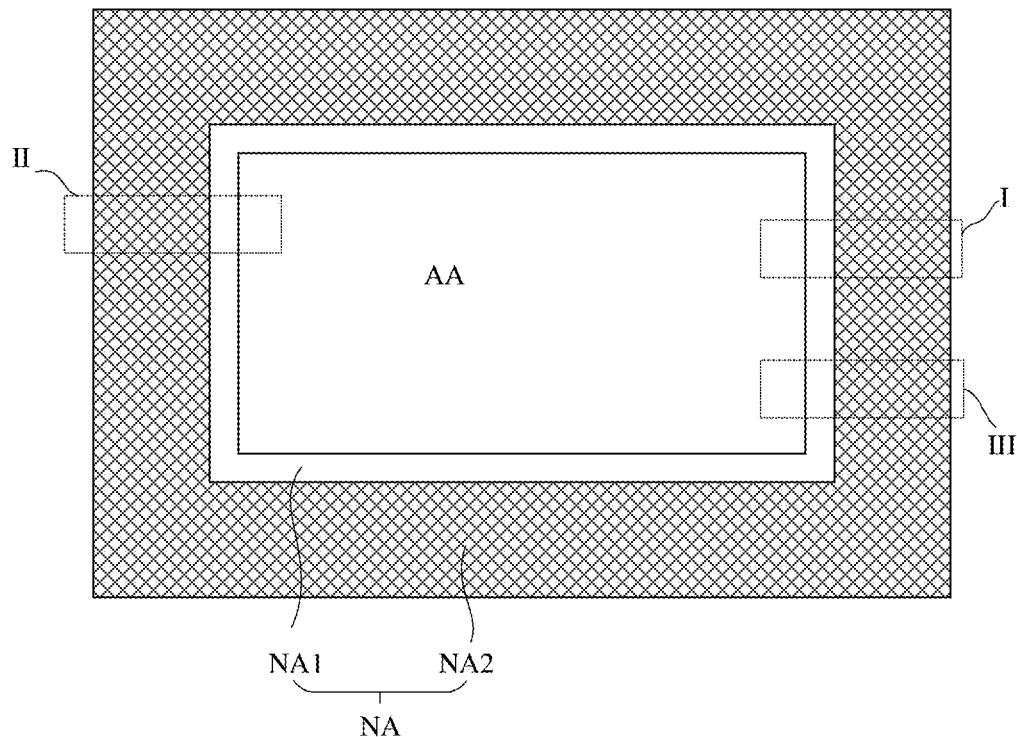
FIG. 3A is a schematic plan view of an array substrate according to some exemplary embodiments of the present disclosure.
Figure 3B:
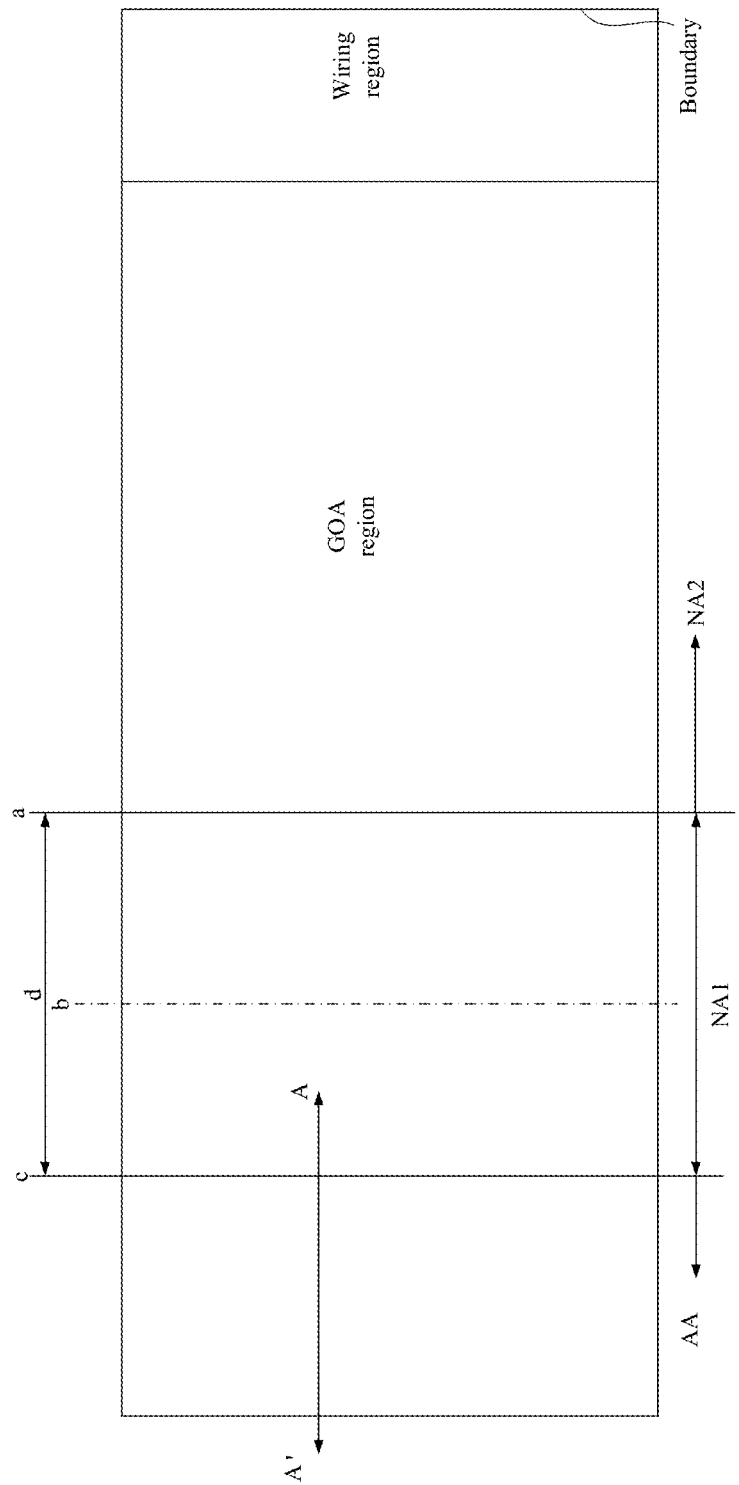
FIG. 3B is a partial enlarged view of part I in FIG. 3A.

Optionally, a material of the light shielding layer 2 may be ink. Referring to FIG. 3A and FIG. 3B in combination, b represents a designed center value of the ink, while a and c respectively represent maximum ranges of the ink that may deviate from the designed center value, which may be, for example, about ±150 microns. In an optional embodiment, the orthographic projection of the light shielding layer 2 on the base substrate surrounds the display region AA, and there is a gap d between the orthographic projection of the light shielding layer 2 on the base substrate 10 and the display region AA. For example, a value range of the gap d may be greater than 0 and less than or equal to 300 microns.

Figure 2A:
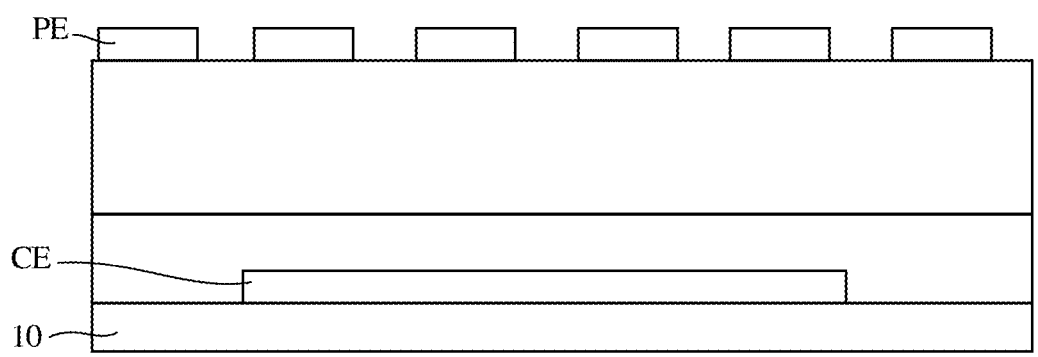
FIG. 2A and FIG. 2B are schematic structural diagrams of an array substrate according to some exemplary embodiments of the present disclosure, respectively, in which an electrode arrangement of pixel units is schematically shown.
Figure 2A:
Figure 2B:
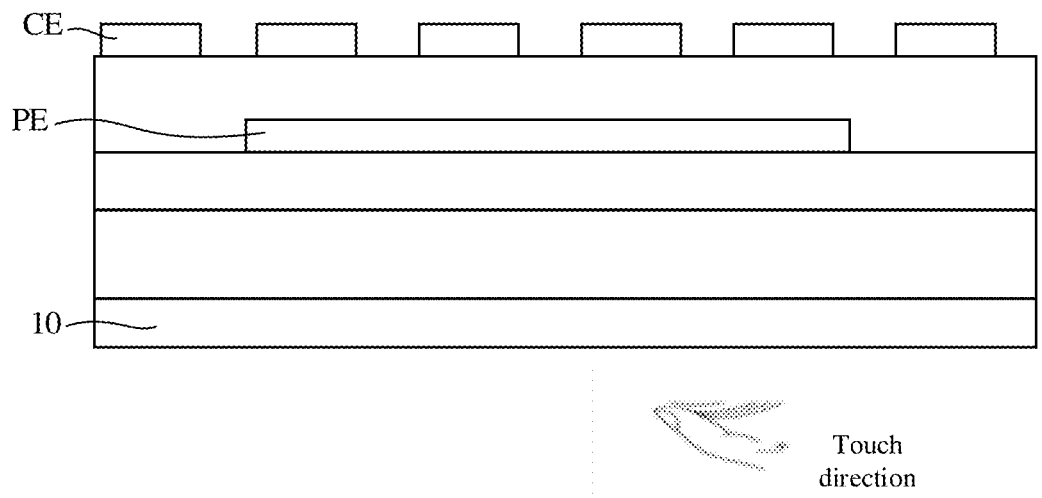

In the embodiments of the present disclosure, a vertical ADS structure may be adopted for the display panel to improve an opening rate of the pixel unit. Referring to FIG. 2A and FIG. 2B, the array substrate may include a common electrode CE and a pixel electrode PE arranged on the base substrate 10. In an example, as shown in FIG. 2A, the common electrode CE may be located on a side close to the user. In another example, as shown in FIG. 2B, the pixel electrode PE may be located on a side close to the user.

In the array substrate, the common electrode CE and the pixel electrode PE may generate corresponding liquid crystal electric fields under driving of a driving signal. Liquid crystals in the liquid crystal layer may deflect under an action of the liquid crystal electric field, thereby achieving a corresponding display function.

Figure 4:
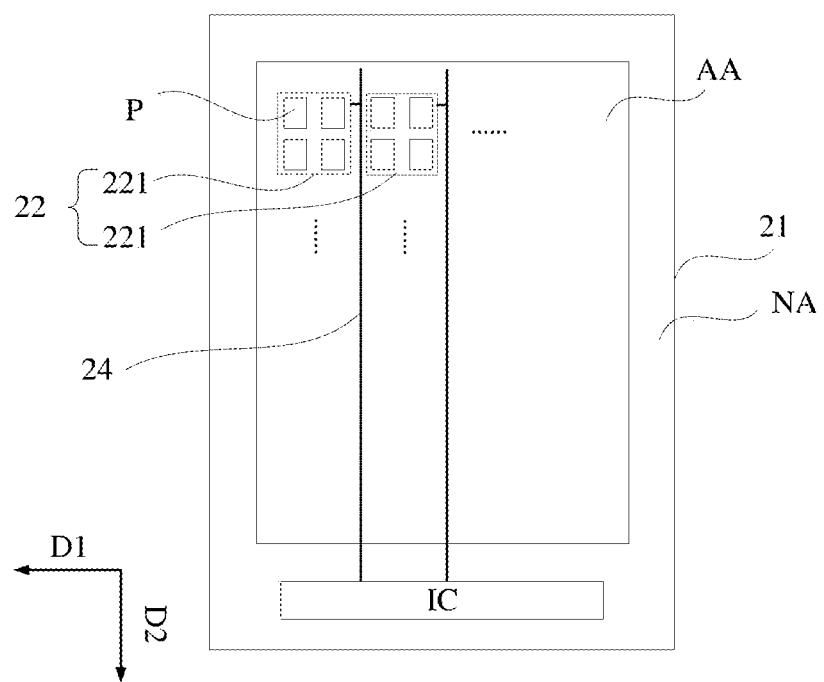
FIG. 4 is a schematic plan view of an array substrate according to some exemplary embodiments of the present disclosure, in which an arrangement of pixel units is schematically shown.
Figure 5:
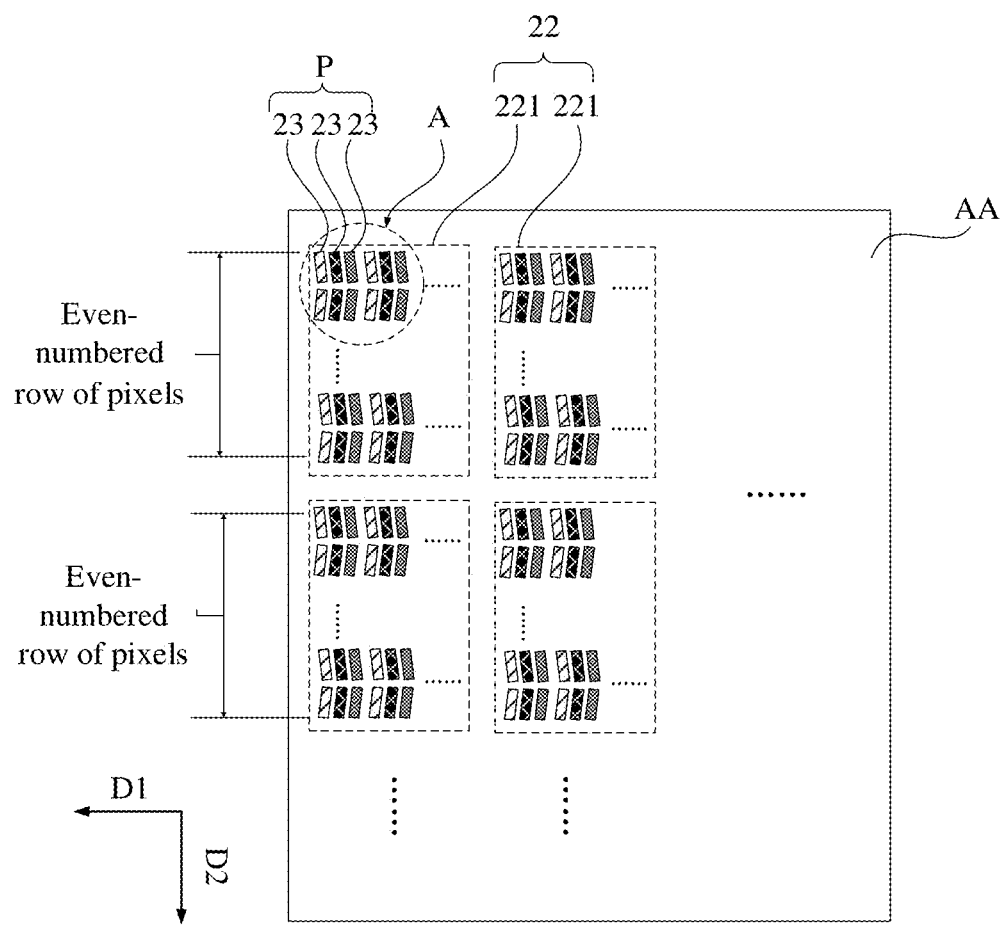
FIG. 5 is a schematic plan view of an array substrate according to some exemplary embodiments of the present disclosure, in which a more detailed arrangement of pixel units is schematically shown.

Optionally, referring to FIG. 4 and FIG. 5, a pixel unit P may include a plurality of sub-pixels 23. The plurality of sub-pixels 23 are divided into a plurality of groups, at least one group includes two adjacent rows of sub-pixels 23, and different groups of sub-pixels 23 are located in different rows. In other words, in the embodiments of the present disclosure, the plurality of rows of sub-pixels 23 are repeatedly arranged in the array substrate, with two rows as a cycle. Furthermore, for any group of sub-pixels 23, the pixel electrodes PE of one row of sub-pixels 23 extend in a first direction, and the pixel electrodes PE of the other row of sub-pixels 23 extend in a second direction. That is, in the embodiments of the present disclosure, a sub-pixel structure design of 2 pixel-2 domain may be adopted for the array substrate.

In the embodiments of the present disclosure, a touch electrode 22 may be multiplexed as a common electrode of a sub-pixel, which will be specifically explained below and will not be described in detail here. As shown in FIG. 4 and FIG. 5, the touch electrode 22 includes a plurality of touch units 221. At least one touch unit 221 is connected to at least one touch line 24, and different touch units 221 are connected to different touch lines 24. For example, each touch unit 221 is connected to one touch line 24, or each touch unit 221 is connected to a plurality of touch lines 24, which may be specifically determined according to actual needs and is not limited here. Each touch unit 221 may be connected to a touch recognition module through the touch line 24. For example, each touch unit 221 is connected to a pin of the touch recognition module through the touch line 24.

In the embodiments of the present disclosure, the non-display region NA of the display substrate includes a signal input side (a lower side of the display region AA in FIG. 4). A drive chip IC may be provided on the signal input side, and the touch recognition module may be integrated into the drive chip IC. For example, the drive chip IC may be a TDDI chip. A plurality of touch lines 24 may extend to the lower side of the display region AA in the second direction D2, thereby connecting with the touch recognition module. In a display stage, the TDDI chip may provide a driving signal for display to the touch unit 221 through the touch line 24. At this time, the touch unit 221 is multiplexed as the common electrode, and a corresponding electric field may be formed between the pixel electrode and the common electrode to achieve the display function. In a touch stage, the TDDI chip may provide a touch signal for touch recognition, so as to achieve the touch function.

Figure 12:
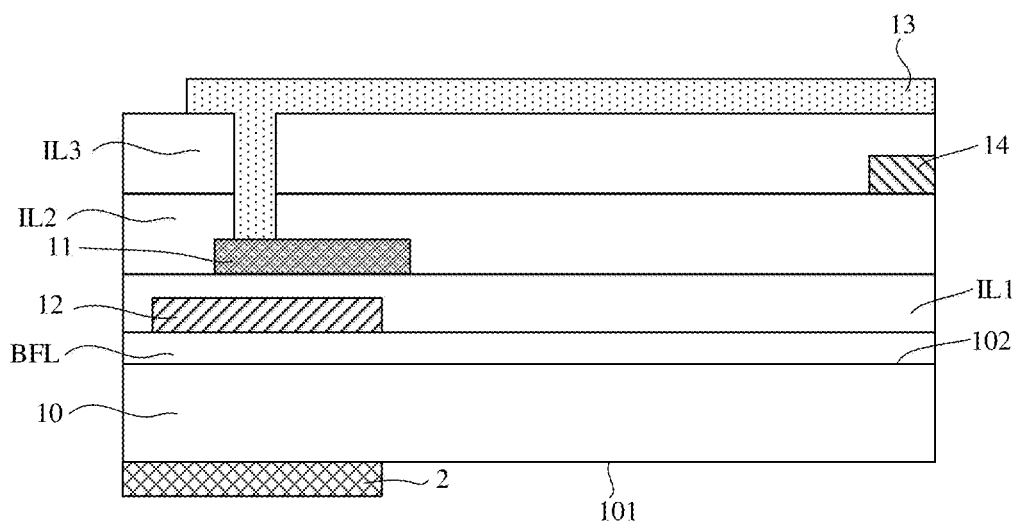
FIG. 12 is a schematic cross-sectional view of an array substrate according to some exemplary embodiments of the present disclosure taken along line AA' in FIG. 3B.

Referring to FIG. 2A, FIG. 2B and FIG. 12 in combination, the array substrate may include: a second metal conductive layer 12 arranged on the base substrate 10, a first metal conductive layer 11 arranged on a side of the second metal conductive layer 12 away from the base substrate 10, a second transparent conductive layer 14 arranged on a side of the first metal conductive layer 11 away from the base substrate 10, and a first transparent conductive layer 13 arranged on a side of the second transparent conductive layer 14 away from the base substrate 10.

For example, the array substrate may further include a plurality of insulation layers, such as a buffer layer BFL arranged between the base substrate 10 and the second metal conductive layer 12, a first insulation layer IL1 arranged between the second metal conductive layer 12 and the first metal conductive layer 11, a second insulation layer IL2 arranged between the first metal conductive layer 11 and the second transparent conductive layer 14, and a third insulation layer IL3 arranged between the second transparent conductive layer 14 and the first transparent conductive layer 13.

In the embodiments of the present disclosure, the pixel unit includes a pixel driving circuit, the pixel driving circuit includes at least one thin film transistor. The thin film transistor includes an active layer, a gate electrode, a source electrode, and a drain electrode. For example, the gate electrode of the thin film transistor is located in the second metal conductive layer 12, while the source electrode and the drain electrode of the thin film transistor are located in the first metal conductive layer 11. One of the pixel electrode PE and the common electrode CE may be located in the first transparent conductive layer 13, while the other of the pixel electrode PE and the common electrode CE may be located in the second transparent conductive layer 14.

Referring to FIG. 6 to FIG. 11 and FIG. 14, the array substrate includes a data signal line DL and a scanning signal line GL. The data signal line DL is used to transmit a data signal to each pixel unit P. The scanning signal line GL is used to transmit a gate scanning signal to each pixel unit P. For example, the data signal line DL may extend from the peripheral region NA to the display region AA, and the scanning signal line GL may extend from the peripheral region NA to the display region AA. In some exemplary embodiments, the scanning signal line GL may mainly extend in the first direction D1, and the data signal line DL may mainly extend in the second direction D2. For example, the scanning signal line GL may be located in the second metal conductive layer 12, and the data signal line DL may be located in the first metal conductive layer 11.

Figure 14:
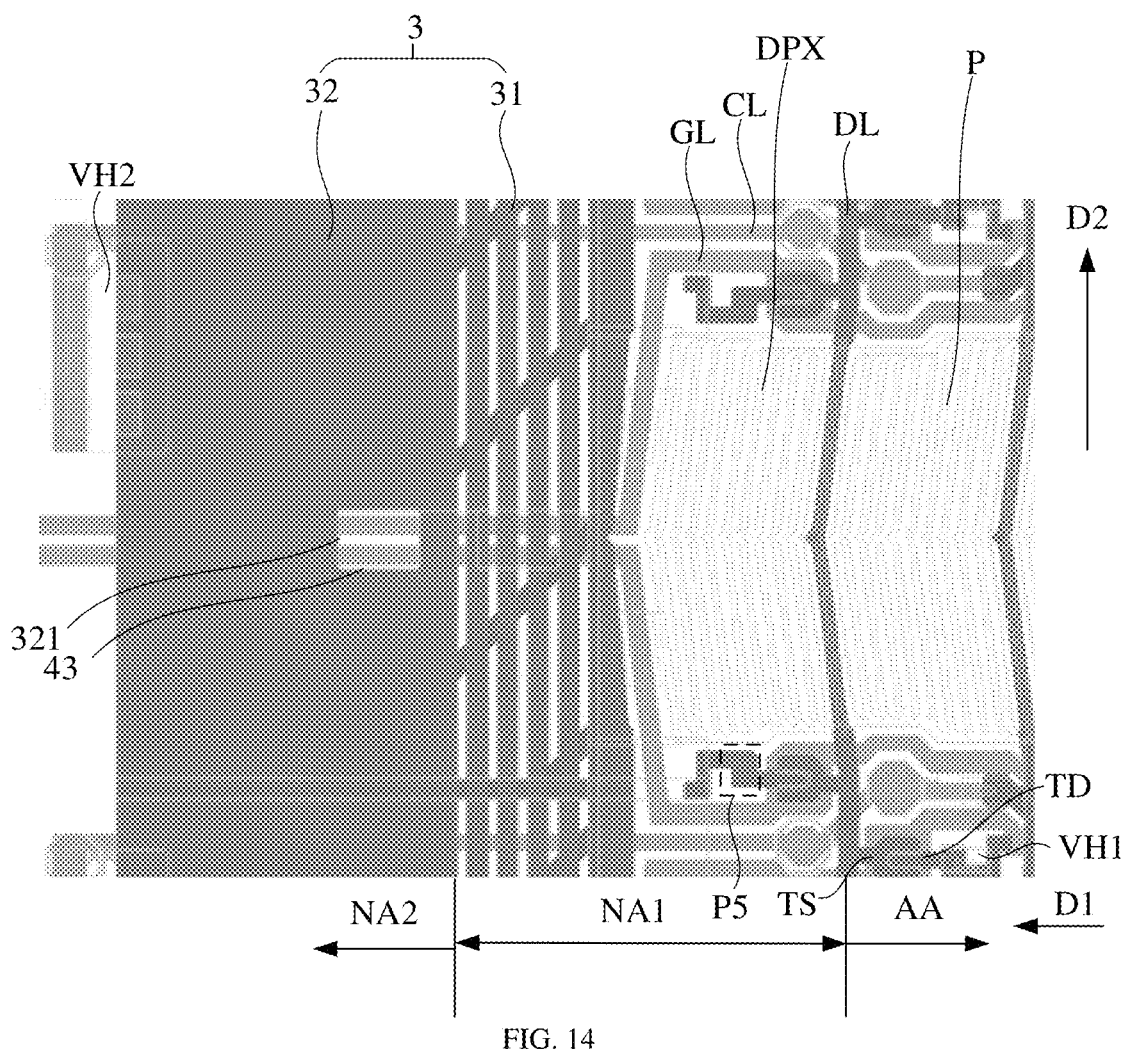
FIG. 14 is a partial enlarged view of part II in FIG. 3A of an array substrate according to some exemplary embodiments of the present disclosure, in which a more detailed arrangement is schematically shown.

Referring to FIG. 14, the array substrate may further include a common electrode line CL. The common electrode line CL is used to transmit a common voltage signal to the common electrode. For example, the common electrode line CL may extend from the peripheral region NA to the display region AA. In some exemplary embodiments, the common electrode line CL may mainly extend in the first direction D1. For example, the common electrode line CL may be located in the second metal conductive layer 12.

For example, a plurality of second via holes VH2 may be provided in the second peripheral region NA2, and the common electrode line CL may be electrically connected to a common electrode bus through the plurality of second via holes VH2. For example, the common electrode line CL may be electrically connected to the first common electrode bus 3 through the plurality of second via holes VH2.

The array substrate may further include the first common electrode bus 3 located on the second surface 102 of the base substrate 10. An orthographic projection of the first common electrode bus 3 on the base substrate 10 is located at least partially in the second peripheral region NA2, and the first common electrode bus 3 is electrically connected to the common electrode CE. The first common electrode bus 3 is used to provide a first voltage signal to the common electrode CE.

In the embodiments of the present disclosure, the first common electrode bus 3 may be located in the first metal conductive layer 11. A distribution density of the first common electrode bus 3 in the first peripheral region NA1 is less than a distribution density of the first common electrode bus 3 in the second peripheral region NA2. In some exemplary embodiments, the first common electrode bus 3 may include a first part 31 located in the first peripheral region NA1 and a second part 32 located in the second peripheral region NA2. A distribution density of the first part 31 of the first common electrode bus 3 located in the first peripheral region NA1 is less than a distribution density of the second part 32 of the first common electrode bus 3 located in the second peripheral region NA2. In some other exemplary embodiments, the first common electrode bus 3 does not include a part located in the first peripheral region NA1, and may only include a part located in the second peripheral region NA2. In this case, the distribution density of the first common electrode bus 3 in the first peripheral region NA1 is substantially 0, and the distribution density of the first common electrode bus 3 in the second peripheral region NA2 is greater than 0, which may also be considered as that the distribution density of the first common electrode bus 3 in the first peripheral region NA1 is less than the distribution density of the first common electrode bus 3 in the second peripheral region NA2.

For example, the common electrode line CL may be electrically connected to the second part 32 of the first common electrode bus 3 through the plurality of second via holes VH2.

It should be noted that the expression "distribution density" here represents an area of a region occupied by a part of the first common electrode bus per unit area in a region enclosed by an outer edge of the first common electrode bus.

In the array substrate provided in the embodiments of the present disclosure, by designing the distribution density of the common electrode bus 3 in the peripheral region that may not be blocked by the light shielding layer 2 to be relatively small, a reflection area of the common electrode bus 3 in such region is greatly reduced, so that the problem of bright metal edge may be effectively improved.

Referring to FIG. 6 to FIG. 10D, the second part 32 of the first common electrode bus 3 located in the second peripheral region NA2 includes a block-shaped metal portion, and the first part 31 of the first common electrode bus 3 located in the first peripheral region NA1 includes a strip-shaped metal portion 312. Specifically, the first part 31 of the first common electrode bus 3 located in the first peripheral region NA1 includes a plurality of strip-shaped metal portions 312 and a plurality of strip-shaped slits 311. The plurality of strip-shaped metal portions 312 and the plurality of strip-shaped slits 311 are alternately arranged in a direction from an edge of the base substrate 10 to the display region AA.

For example, the second part 32 is a block-shaped metal portion. Herein, the expression "block-shaped metal portion" may refer to a piece of metal without a hollow structure.

In the embodiments of the present disclosure, a ratio of a length of the plurality of strip-shaped slits in an extension direction thereof to a width of the strip-shaped slits in a direction perpendicular to the extension direction thereof is greater than or equal to 10. A ratio of a length of the plurality of strip-shaped metal portions in an extension direction thereof to a width of the strip-shaped metal portions in a direction perpendicular to the extension direction thereof is greater than or equal to 10. That is, in the first peripheral region NA1, the slit or metal portion of the first common electrode bus 3 has a large length-width ratio, thus presenting a strip structure.

In the embodiments of the present disclosure, the plurality of strip-shaped slits are formed in the part of the first common electrode bus 3 located in the first peripheral region NA1. In this way, it is possible to avoid forming bulk metals in the first peripheral region NA1, and the problem of bright metal edge may be effectively improved. Meanwhile, there is no need to form a large-area missing-material part such as a hole in the first common electrode bus 3, which may avoid an excessive total resistance of the first common electrode bus 3. In addition, during a subsequent PI coating process, it is possible to prevent PI from aggregating around the strip-shaped slits, so that a phenomenon that a local display tends to be black due to the PI aggregation may be avoided.

In the array substrate provided in the embodiments of the present disclosure, the base substrate 10 may include a first side, a second side, a third side, and a fourth side. The first side and the second side are arranged opposite to each other, and the third side and the fourth side are arranged opposite to each other. For example, the scanning signal line GL extends from the first side toward the second side, and the data signal line DL extends from the third side toward the fourth side. For example, the first side and the second side may be a left side and a right side of the base substrate 10, respectively, and the third side and the fourth side may be an upper side and a lower side of the base substrate 10, respectively.

On the first side and the second side of the array substrate, the plurality of strip-shaped metal portions 312 and the plurality of strip-shaped slits 311 are arranged alternately in an left and right direction. On the third side and the fourth side of the array substrate, the plurality of strip-shaped metal portions 312 and the plurality of strip-shaped slits 311 are arranged alternately in an up and down directions.

The strip-shaped slit 311 has a first width W1 in the first direction, and the strip-shaped metal portion 312 has a second width W2 in the first direction. The first direction is substantially perpendicular to the extension direction of the strip-shaped slit or the extension direction of the strip-shaped metal portion. For example, on the first side and the second side of the array substrate, the first direction is the left and right direction, while on the third side and the fourth side of the array substrate, the first direction is the up and down direction.

In the embodiments of the present disclosure, a value of dividing the first width W1 by a sum of the first width W1 and the second width W2 is greater than or equal to 0.5. For example, the value of dividing the first width W1 by the sum of the first width W1 and the second width W2 is greater than or equal to 0.52, which is between 0.52 and 0.9.

Through researches, the inventors found that in the embodiments of the present disclosure, as long as a hollow ratio of the strip-shaped slit (i.e., the value of dividing the first width W1 by the sum of the first width W1 and the second width W2) is greater than or equal to 0.5, the metal reflection phenomenon may not be observed visually.

It should be noted that the extension direction, an inclination angle and other design parameters of the strip-shaped slit are not specifically limited in the embodiments of the present disclosure.

Figure 11:
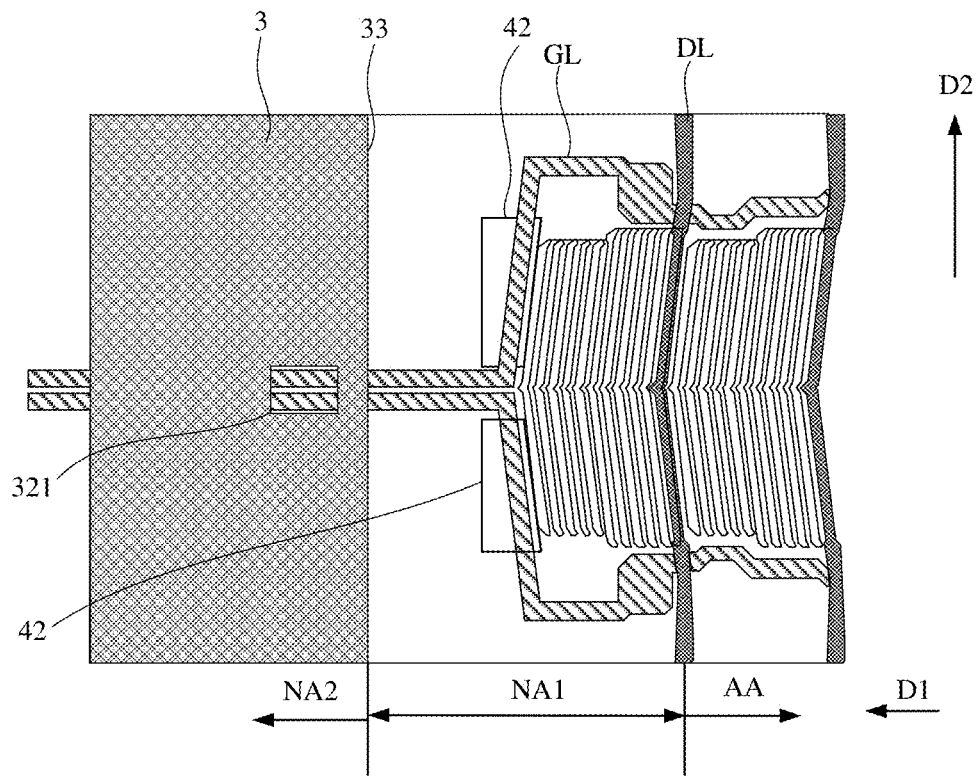
FIG. 11 is a partial enlarged view of part IV in FIG. 7 of an array substrate according to some other exemplary embodiments of the present disclosure.

Referring to FIG. 11, in the embodiments of the present disclosure, an orthographic projection of a boundary 33 of the first common electrode bus 3 close to the display region AA on the base substrate 10 is located at a junction of the first peripheral region NA1 and the second peripheral region NA2.

The orthographic projection of the boundary 33 of the first common electrode bus 3 close to the display region AA on the base substrate 10 is located in the orthographic projection of the light shielding layer 2 on the base substrate 10.

In such embodiment, the first common electrode bus is substantially not arranged in the first peripheral region NA1. That is, by not arranging the common electrode bus 3 in the peripheral region that may not be blocked by the light shielding layer 2, a reflection area of the common electrode bus 3 in such region is reduced to substantially 0, so that the problem of bright metal edge may be effectively improved.

Figure 13:
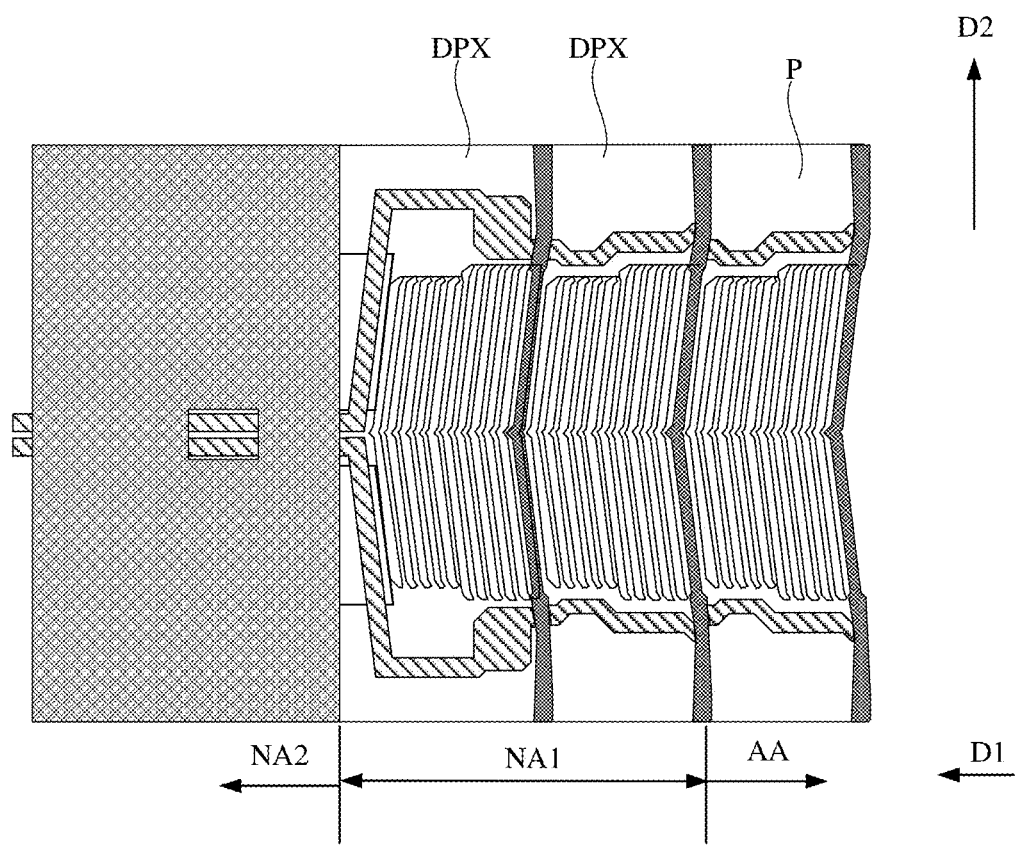
FIG. 13 is a partial enlarged view of part IV in FIG. 7 of an array substrate according to some other exemplary embodiments of the present disclosure.
Figure 15:
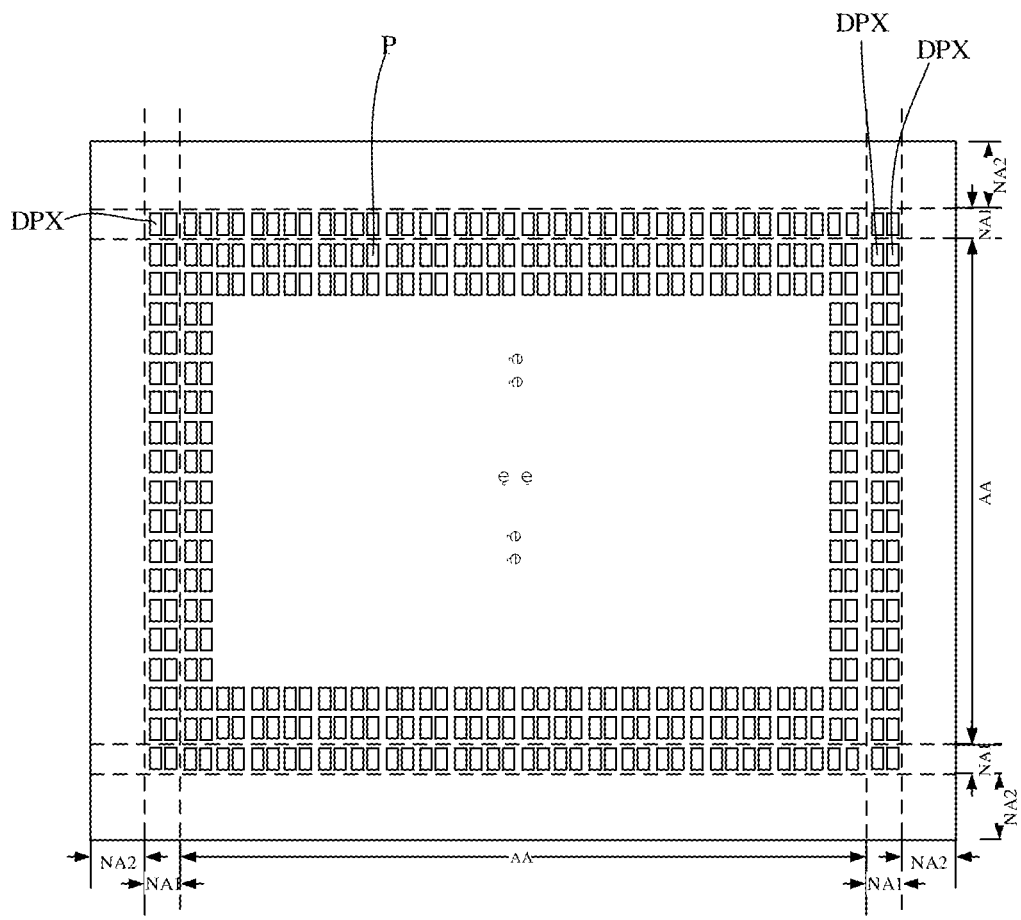
FIG. 15 is a schematic plan view of an array substrate according to some exemplary embodiments of the present disclosure, in which a pixel unit and a dummy pixel unit are schematically shown.

Referring to FIG. 13 and FIG. 15, in the embodiments of the present disclosure, at least two columns of dummy pixel units (DPX) are provided in the first peripheral region NA1 on at least one of the first side and the second side. The dummy pixel unit DPX may be a dummy sub-pixel unit, such as one of three sub-pixels RGB.

For example, referring to FIG. 15, in the embodiments of the present disclosure, at least one row of dummy pixel units DPX is provided in the first peripheral region NA1 on at least one of the third side and the fourth side.

Referring to FIG. 14, a pixel driving circuit may be provided on the array substrate, and the pixel driving circuit may include a transistor. For example, for the pixel unit P, FIG. 14 schematically shows a source electrode TS and a drain electrode TD of a transistor. The drain electrode TD of the transistor may be electrically connected to the pixel unit, for example, to a pixel electrode of a sub-pixel, through a first via hole VH1. For the dummy pixel unit DPX, at a position P5 corresponding to the first via hole VH1, no via hole for electrically connecting the drain electrode TD of the transistor with the pixel unit is formed. That is, the pixel driving circuit of the dummy pixel unit DPX is not electrically connected to the pixel electrode.

Referring to FIG. 6 to FIG. 13 in combination, the array substrate may further include a second common electrode bus 4 which is located on the second surface 102 of the base substrate. An orthographic projection of the second common electrode bus 4 on the base substrate is located in the first peripheral region NA1 and the second peripheral region NA2, and the second common electrode bus 4 is electrically connected to the first common electrode bus 3. For example, the second common electrode bus 4 is located in the first transparent conductive layer 13.

In the embodiments of the present disclosure, the second common electrode bus 4 includes a block-shaped conductive portion. For example, the second common electrode bus 4 may be made of a transparent conductive material such as indium tin oxide. Therefore, the second common electrode bus 4 with a block-shaped structure may directly transmit light without reflecting light, and the problem of bright edge may not occur. In addition, the second common electrode bus 4 and the first common electrode bus 3 are electrically connected for parallel transmission of the first voltage signal, which may effectively reduce the total resistance on the common electrode bus and thus reduce an influence of an IR drop.

Exemplarily, on at least one of the first side and the second side, the first part 31 of the first common electrode bus 3 located in the first peripheral region NA1 includes a plurality of first strip-shaped metal portions 3121 and a plurality of second strip-shaped metal portions 3122. The plurality of first strip-shaped metal portions 3121 extend in the second direction D2, and the plurality of second strip-shaped metal portions 3122 extend in a third direction D3 intersecting with the second direction D2. For example, the first direction D1 intersects with the third direction D3. The plurality of first strip-shaped metal portions 3121 and the plurality of second strip-shaped metal portions 3122 form a grid shape, and a plurality of hollow slits are formed inside the grid shape. In this way, it is possible to avoid forming bulk metals in the first peripheral region NA1, so that the problem of bright metal edge may be effectively improved. Meanwhile, there is no need to form a large-area missing-material part in the first common electrode bus 3, which may avoid an excessive total resistance of the first common electrode bus 3. Moreover, the intersection of the third direction D3 and the first direction D1 may cause an irregular arrangement of the slits in the first direction, thereby avoiding problems such as Moire pattern caused by light transmission and/or light reflection.

Figure 6:
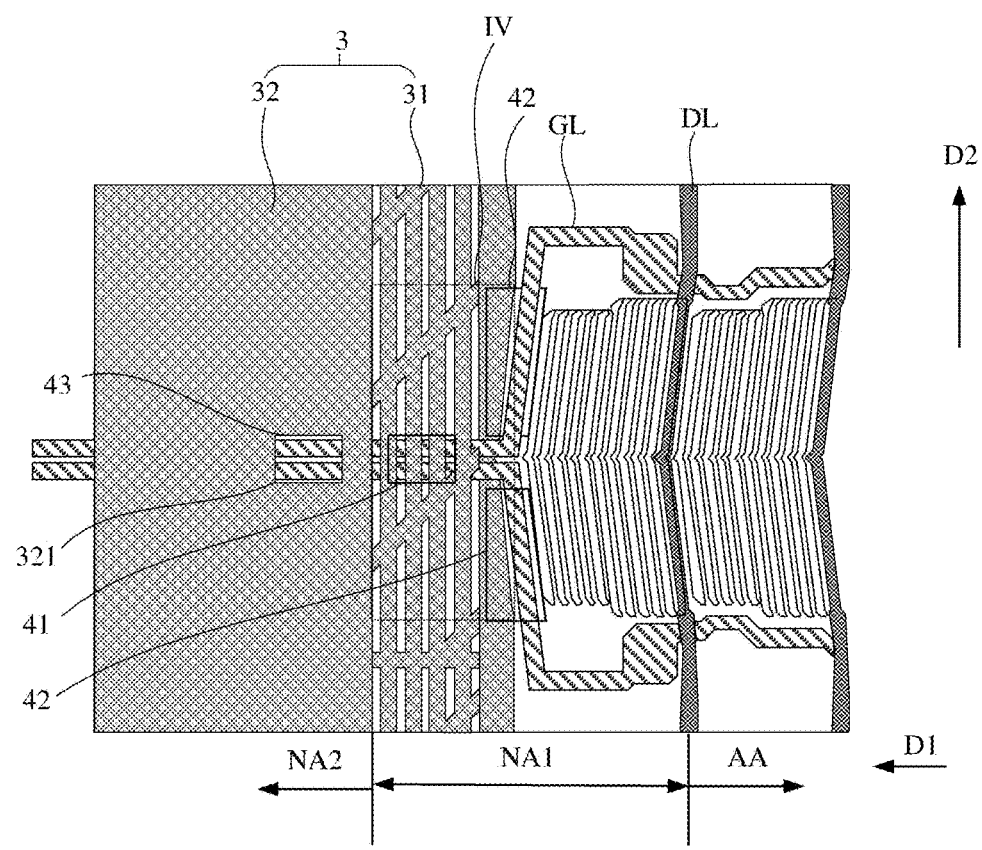
FIG. 6 is a partial enlarged view of part II in FIG. 3A of the array substrate according to some exemplary embodiments of the present disclosure.
Figure 7:
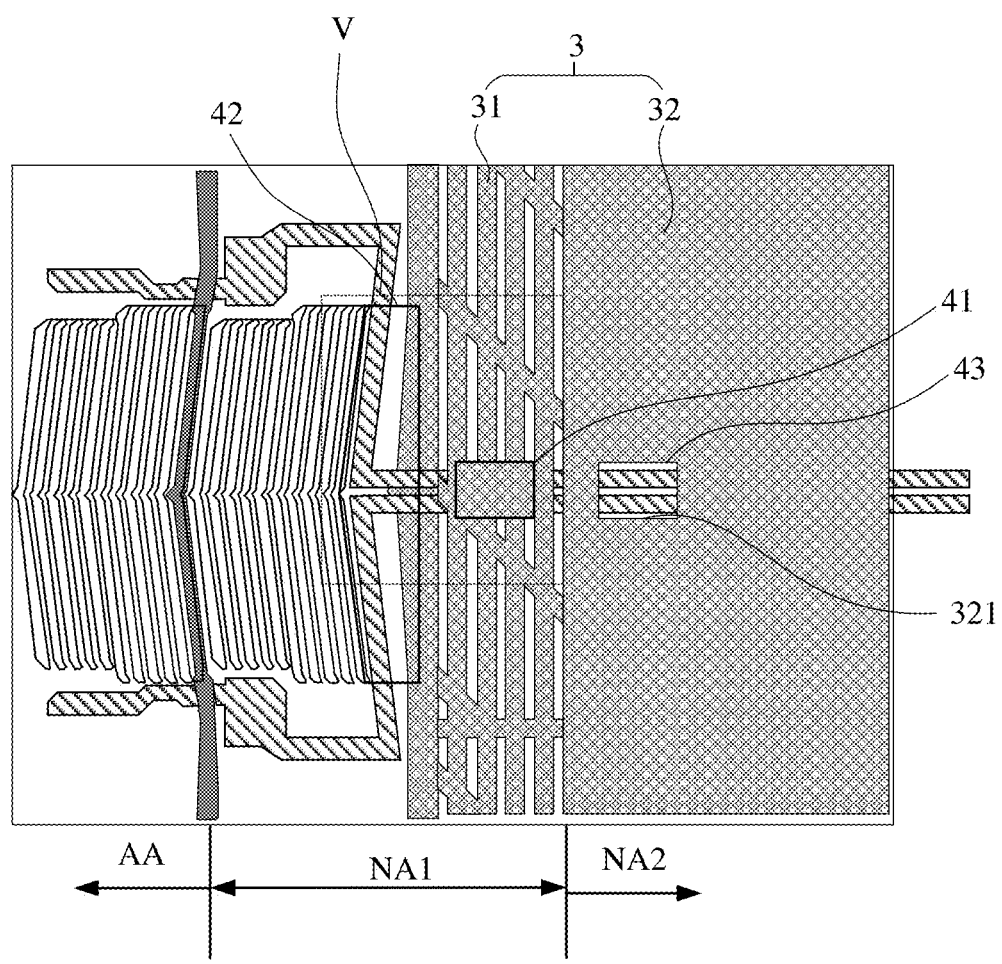
FIG. 7 is a partial enlarged view of part III in FIG. 3A of an array substrate according to some exemplary embodiments of the present disclosure.
Figure 8:
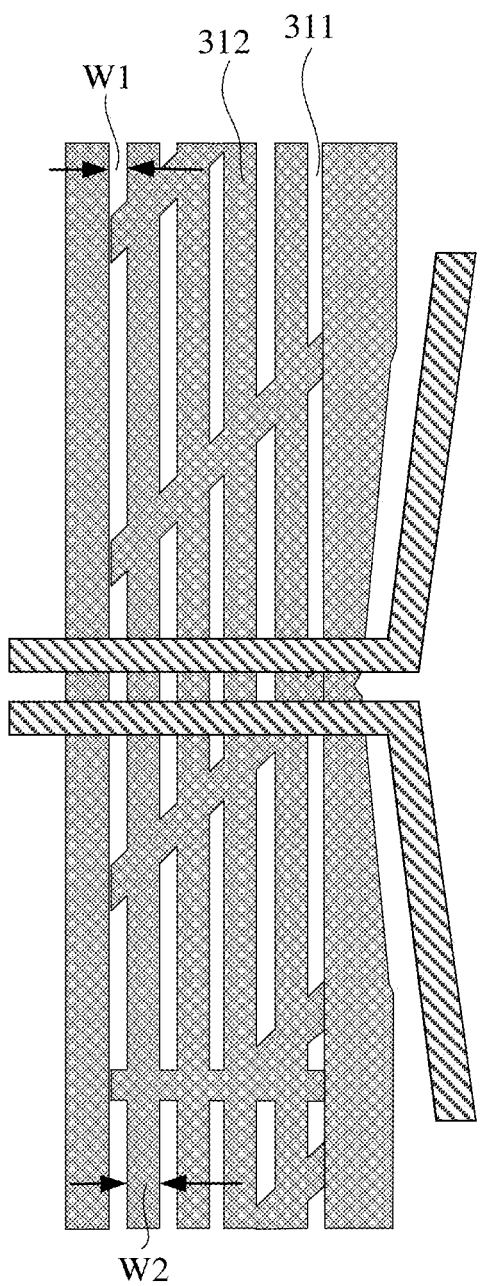
FIG. 8 is a partial enlarged view of part IV in FIG. 6 of an array substrate according to some exemplary embodiments of the present disclosure.
Figure 9:
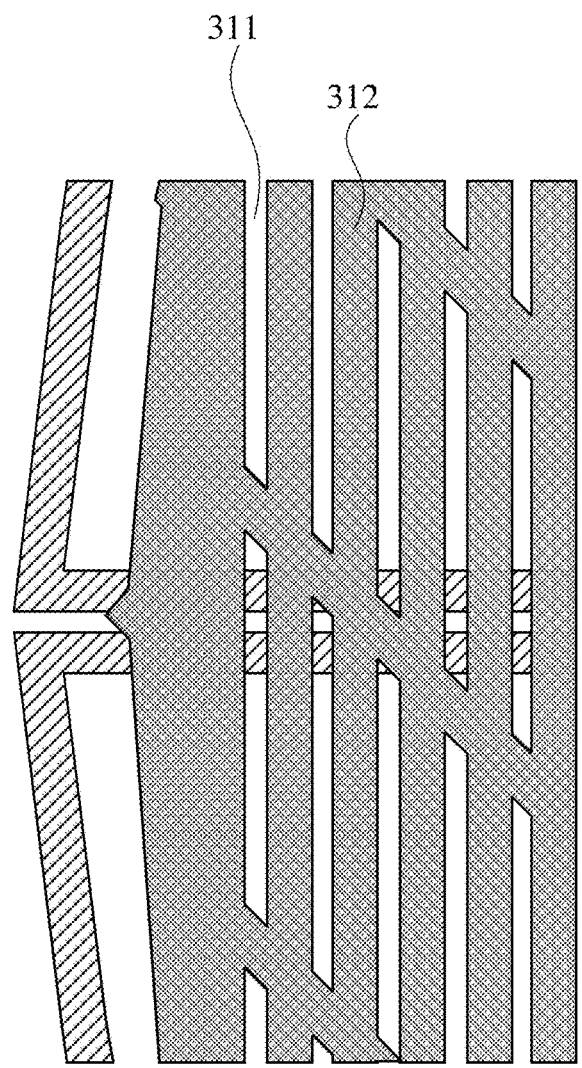
FIG. 9 is a partial enlarged view of part V in FIG. 7 of an array substrate according to some exemplary embodiments of the present disclosure.
Figure 10A:
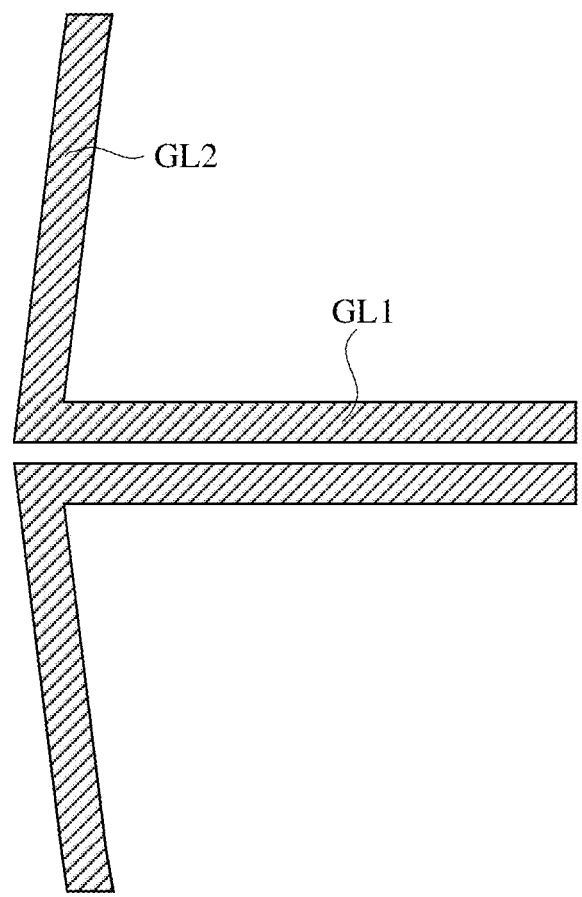
FIG. 10A is a schematic plan view of the part in FIG. 9 in a metal conductive layer.
Figure 10B:
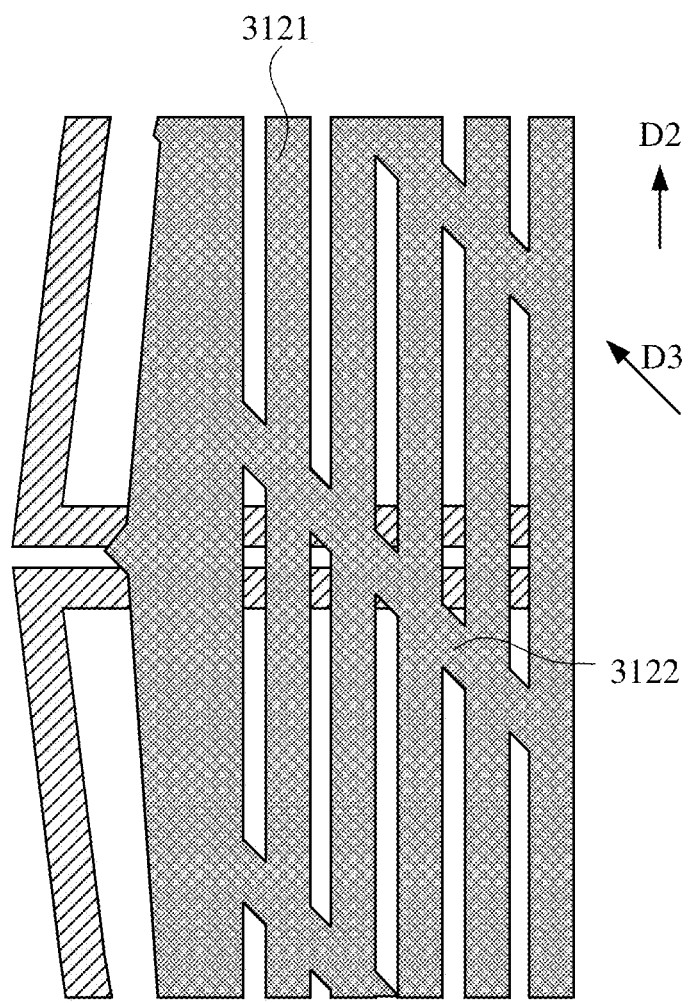
FIG. 10B is a schematic plan view of the part in FIG. 9 in two metal conductive layers.
Figure 10C:
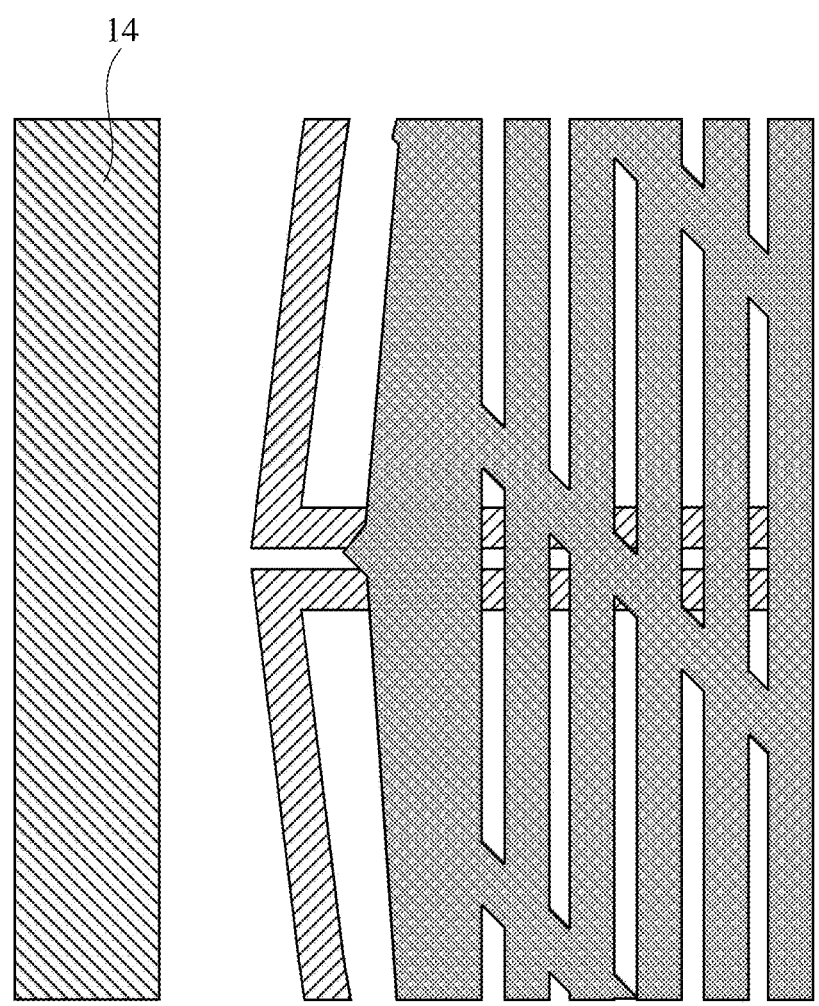
FIG. 10C is a schematic plan view of the part in FIG. 9 in two metal conductive layers and a transparent conductive layer.
Figure 10D:
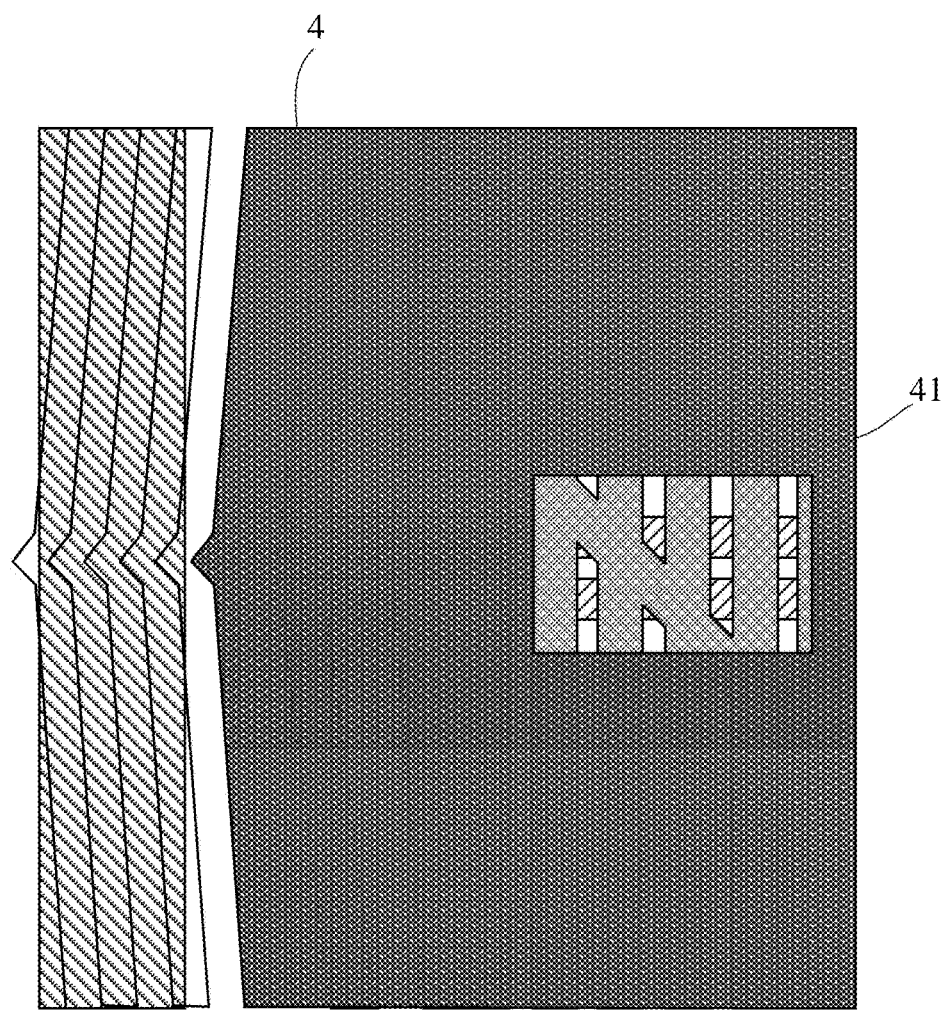
FIG. 10D is a schematic plan view of the part in FIG. 9 in two metal conductive layers and two transparent conductive layers.

Referring to FIG. 6, FIG. 7 and FIG. 10D, the second common electrode bus 4 includes at least one second opening 41 which is located in the first peripheral region NA1. An orthographic projection of at least one intersecting portion between the plurality of first strip-shaped metal portions 3121 and the plurality of second strip-shaped metal portions 3122 on the base substrate overlaps at least partially with an orthographic projection of the at least one second opening 41 on the base substrate.

On at least one of the first side and the second side, a part of the scanning signal line GL located in the peripheral region includes a first scanning signal sub-portion GL1 and a second scanning signal sub-portion GL2. The first scanning signal sub-portion GL1 extends in the first direction D1, and the second scanning signal sub-portion GL2 extends in the second direction D2 intersecting with the first direction D1.

In the embodiments of the present disclosure, an extension direction of the second scanning signal sub-portion GL2 is substantially parallel to an extension direction of the data signal line DL. Through such design, the second scanning signal sub-portion GL2 does not overlap with an adjacent common electrode bus located in the first metal conductive layer 11, thereby minimizing an overlapping area between the scanning signal line GL located in the second metal conductive layer 12 and the common electrode bus located in the first metal conductive layer 11. In this way, it is possible to reduce a generated parasitic capacitance, and loads on the scanning signal line and the common electrode bus may be reduced.

For example, an orthographic projection of the first scanning signal sub-portion GL1 on the base substrate overlaps at least partially with the orthographic projection of the at least one second opening 41 on the base substrate. In such embodiment, at least one second opening 41 is provided in the first transparent conductive layer 13, so that the overlapping area between the second common electrode bus 4 located in the first transparent conductive layer 13 and the beneath first scanning signal sub-portion GL1 may be reduced. In this way, it is possible to reduce the generated parasitic capacitance, and the loads on the scanning signal line and the common electrode bus may be reduced.

For another example, an orthographic projection of at least one intersecting portion of the first strip-shaped metal portion 3121, the second strip-shaped metal portion 3122 and the first scanning signal sub-portion GL1 on the base substrate overlaps at least partially with the orthographic projection of the at least one second opening 41 on the base substrate. In such embodiment, the at least one second opening 41 in the first transparent conductive layer 13 exposes the first common electrode bus and the scanning signal line located below, so that an overlapping area of the three may be reduced. In this way, it is possible to reduce the generated parasitic capacitance, and the loads on the scanning signal line and the common electrode bus may be reduced.

For example, the second part 32 of the first common electrode bus 3 located in the second peripheral region NA2 includes at least one first opening 321. An orthographic projection of the at least one first opening 321 of the first common electrode bus on the base substrate overlaps at least partially with the orthographic projection of the first scanning signal sub-portion GL1 on the base substrate. In such embodiment, the at least one first opening 321 is arranged in the first metal conductive layer 11, so that an overlapping area between the first common electrode bus 3 located in the first metal conductive layer 11 and the first scanning signal sub-portion GL1 located below may be reduced. In this way, it is possible to reduce the generated parasitic capacitance, and the loads on the scanning signal line and the common electrode bus may be reduced.

For example, the first transparent conductive layer 13 may further include at least one third opening 42. An orthographic projection of the second scanning signal sub-portion GL2 on the base substrate overlaps at least partially with an orthographic projection of the at least one third opening 42 on the base substrate. In such embodiment, the at least one third opening 42 is arranged in the first transparent conductive layer 13, so that an overlapping area between the second common electrode bus 4 located in the first transparent conductive layer 13 and the second scanning signal sub-portion GL2 located below may be reduced. In this way, it is possible to reduce the generated parasitic capacitance, and the loads on the scanning signal line and the common electrode bus may be reduced.

For example, the first transparent conductive layer 13 may further include at least one fourth opening 43, and a position of the fourth opening 43 may correspond to a position of the first opening 321. That is, an orthographic projection of the fourth opening 43 on the base substrate may overlap at least partially with the orthographic projection of the first opening 321 on the base substrate. For example, the orthographic projection of the fourth opening 43 on the base substrate may substantially coincide with the orthographic projection of the first opening 321 on the base substrate. In such embodiment, the at least one fourth opening 43 is arranged in the first transparent conductive layer 13, so that an overlapping area between the second common electrode bus 4 located in the first transparent conductive layer 13 and the first scanning signal sub-portion GL1 located below may be reduced. In this way, it is possible to reduce the generated parasitic capacitance, and the loads on the scanning signal line and the common electrode bus may be reduced.

The embodiments of the present disclosure further provide a display device including the array substrate described above or display panel. For example, examples of the display device include a tablet personal computer (PC), a smart phone, a personal digital assistant (PDA), a portable multimedia player, a game console, a wrist watch-type electronic device, etc. However, the embodiments of the present disclosure are not intended to limit a type of the display device. In some exemplary embodiments, the display device may be used not only in a large electronic device such as a television (TV) or an external billboard, but also in a medium or small electronic device such as a PC, a laptop computer, a vehicle navigation device, or a camera.

Those skilled in the art may understand that features recited in various embodiments and/or claims of the present disclosure may be combined in various ways, even if such combinations are not explicitly described in the present disclosure. In particular, features described in the embodiments and/or the claims of the present disclosure may be combined in various ways without departing from the spirit and teachings of the present disclosure. All these combinations fall within the scope of the present disclosure. The embodiments of the present disclosure have been described above. However, these embodiments are for illustrative purposes only, and are not intended to limit the scope of the present disclosure. Although various embodiments have been described separately above, it does not mean that measures in the various embodiments may not be used in combination advantageously. The scope of the present disclosure is defined by the appended claims and their equivalents. Those skilled in the art may make various substitutions and modifications without departing from the scope of the present disclosure, and those substitutions and modifications should all fall within the scope of the present disclosure.

What is claimed is:

1. An array substrate, comprising:
a base substrate comprising a first surface and a second surface opposite to the first surface, wherein the base substrate comprises a display region and a peripheral region surrounding the display region, the peripheral region comprises a first peripheral region surrounding the display region and a second peripheral region surrounding the first peripheral region;
a plurality of pixel units located on the second surface of the base substrate, wherein orthographic projections of the plurality of pixel units on the base substrate are located in the display region and distributed in an array, and at least one of the plurality of pixel units comprises a common electrode;
a light shielding layer located on the first surface of the base substrate, wherein an orthographic projection of the light shielding layer on the base substrate is located in the peripheral region, and at least part of the orthographic projection of the light shielding layer on the base substrate is located in the second peripheral region; and
a first common electrode bus located on the second surface of the base substrate, wherein an orthographic projection of the first common electrode bus on the base substrate is located at least partially in the second peripheral region, and the first common electrode bus is electrically connected to the common electrode,
wherein a material of the first common electrode bus comprises a metal material, and a distribution density of the first common electrode bus in the first peripheral region is less than a distribution density of the first common electrode bus in the second peripheral region;
wherein an orthographic projection of a boundary of the first common electrode bus close to the display region on the base substrate is located at a junction of the first peripheral region and the second peripheral region; and
wherein the orthographic projection of the boundary of the first common electrode bus close to the display region on the base substrate is located in the orthographic projection of the light shielding layer on the base substrate.

2. The array substrate according to claim 1, wherein the first common electrode bus comprises a first part located in the first peripheral region and a second part located in the second peripheral region, the second part comprises a block-shaped metal portion, and wherein the first part comprises a strip-shaped metal portion.

3. The array substrate according to claim 2, wherein the first part of the first common electrode bus located in the first peripheral region comprises a plurality of strip-shaped metal portions and at least one strip-shaped slit, and the plurality of strip-shaped metal portions and the at least one strip-shaped slit are alternately arranged in a direction from an edge of the base substrate to the display region of the base substrate.

4. The array substrate according to claim 3, wherein the strip-shaped slit has a first width in a first direction, the strip-shaped metal portion has a second width in the first direction, and the first direction is substantially perpendicular to an extension direction of the strip-shaped slit or an extension direction of the strip-shaped metal portion; and wherein a value of dividing the first width by a sum of the first width and the second width is greater than or equal to 0.5.

5. The array substrate according to claim 3, wherein a ratio of a length of the at least one strip-shaped slit in an extension direction of the at least one strip-shaped slit to a width of the at least one strip-shaped slit in a direction perpendicular to the extension direction of the at least one strip-shaped slit is greater than or equal to 10.

6. The array substrate according to claim 1, wherein the base substrate comprises a first side, a second side, a third side and a fourth side, the first side and the second side are arranged opposite to each other, and the third side and the fourth side are arranged opposite to each other;

wherein the array substrate further comprises a data signal line and a scanning signal line arranged on the second surface of the base substrate, the scanning signal line extends from the first side toward the second side, and the data signal line extends from the third side toward the fourth side; and wherein at least two columns of dummy pixel units are arranged in the first peripheral region on at least one of the first side and the second side.

7. The array substrate according to claim 6, wherein at least one row of dummy pixel units is arranged in the first peripheral region on at least one of the third side and the fourth side.

8. The array substrate according to claim 6, wherein on at least one of the first side and the second side, the first part of the first common electrode bus located in the first peripheral region comprises a plurality of first strip-shaped metal portions extending in a second direction, and a plurality of second strip-shaped metal portions extending in a third direction intersecting with the second direction.

9. The array substrate according to claim 8, wherein the first direction intersects with the third direction.

10. The array substrate according to claim 1, wherein the base substrate comprises a first side, a second side, a third side and a fourth side, the first side and the second side are arranged opposite to each other, and the third side and the fourth side are arranged opposite to each other;

wherein the array substrate further comprises a data signal line and a scanning signal line arranged on the second surface of the base substrate, the scanning signal line extends from the first side toward the second side, and the data signal line extends from the third side toward the fourth side; and wherein at least one column of dummy pixel units is arranged between a first part and the display region in the first peripheral region on at least one of the first side and the second side.

11. The array substrate according to claim 10, wherein the array substrate further comprises a second common electrode bus located on the second surface of the base substrate, an orthographic projection of the second common electrode bus on the base substrate is located in the first peripheral region and the second peripheral region, and the second common electrode bus is electrically connected to the first common electrode bus.

12. The array substrate according to claim 11, wherein on at least one of the first side and the second side, the first part of the first common electrode bus located in the first peripheral region comprises a plurality of first strip-shaped metal portions extending in a second direction, and a plurality of second strip-shaped metal portions extending in a third direction intersecting with the second direction; and wherein the second common electrode bus comprises at least one second opening located in the first peripheral region, and an orthographic projection of at least one intersecting portion between the plurality of first strip-shaped metal portions and the plurality of second strip-shaped metal portions on the base substrate overlaps at least partially with an orthographic projection of the at least one second opening on the base substrate.

13. The array substrate according to claim 12, wherein on at least one of the first side and the second side, a part of the scanning signal line located in the peripheral region comprises a first scanning signal sub-portion and a second scanning signal sub-portion, the first scanning signal sub-portion extends in a first direction, and the second scanning signal sub-portion extends in the second direction intersecting with the first direction;

wherein an extension direction of the second scanning signal sub-portion is substantially parallel to an extension direction of the data signal line;

wherein an orthographic projection of the first scanning signal sub-portion on the base substrate overlaps at least partially with the orthographic projection of the at least one second opening on the base substrate; and/or wherein an orthographic projection of at least one intersecting portion of the first strip-shaped metal portion, the second strip-shaped metal portion and the first scanning signal sub-portion on the base substrate overlaps at least partially with the orthographic projection of the at least one second opening on the base substrate; and wherein the second part comprises at least one first opening, and an orthographic projection of the at least one first opening on the base substrate overlaps at least partially with the orthographic projection of the first scanning signal sub-portion on the base substrate.

14. The array substrate according to claim 1, wherein the array substrate further comprises a second common electrode bus located on the second surface of the base substrate, an orthographic projection of the second common electrode bus on the base substrate is located in the first peripheral region and the second peripheral region, and the second common electrode bus is electrically connected to the first common electrode bus.

15. The array substrate according to claim 14, wherein the array substrate comprises a first metal conductive layer and a first transparent conductive layer arranged on the second surface of the base substrate, the first common electrode bus is located in the first metal conductive layer, and the second common electrode bus is located in the first transparent conductive layer.

16. The array substrate according to claim 15, wherein the array substrate further comprises a data signal line and a scanning signal line arranged on the second surface of the base substrate, and the array substrate further comprises a second metal conductive layer arranged on the base substrate and a second transparent conductive layer arranged on the base substrate;
   wherein the data signal line is located in the first metal conductive layer, and the scanning signal line is located in the second metal conductive layer; and
   wherein the at least one of the plurality of pixel units further comprises a pixel electrode located in the first transparent conductive layer, and the common electrode is located in the second transparent conductive layer.

17. The array substrate according to claim 14, wherein on at least one of the first side and the second side, a first part of the first common electrode bus located in the first peripheral region comprises a plurality of first strip-shaped metal portions extending in a second direction, and a plurality of second strip-shaped metal portions extending in a third direction intersecting with the second direction; and
   wherein the second common electrode bus comprises at least one second opening located in the first peripheral region, and an orthographic projection of at least one intersecting portion between the plurality of first strip-shaped metal portions and the plurality of second strip-shaped metal portions on the base substrate overlaps at least partially with an orthographic projection of the at least one second opening on the base substrate.

18. A display device, comprising:
   the array substrate according to claim 1;
   an opposite substrate arranged opposite to the array substrate; and
   a liquid crystal layer located between the array substrate and the opposite substrate,
   wherein a light emitting surface of the display device is the first surface of the base substrate in the array substrate.

* * * * *